United States Patent
Chiu

(10) Patent No.: US 7,279,976 B1
(45) Date of Patent: Oct. 9, 2007

(54) DIFFERENTIAL AMPLIFIER WITH CONTROLLED COMMON MODE OUTPUT VOLTAGE

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 168 days.

(21) Appl. No.: 11/160,238

(22) Filed: Jun. 15, 2005

(51) Int. Cl.
  *H03F 3/45* (2006.01)
(52) U.S. Cl. ....................................................... 330/259

(58) Field of Classification Search ......... 330/258–260
See application file for complete search history.

(56) References Cited

U.S. PATENT DOCUMENTS 7,088,179 B2 *   8/2006   Gilbert et al. ............... 330/254

* cited by examiner

*Primary Examiner*—Robert Pascal
*Assistant Examiner*—Hieu Nguyen
(74) *Attorney, Agent, or Firm*—Vedder, Price, Kaufman & Kammholz, P.C.

(57) ABSTRACT

A differential amplifier circuit with a self-controlled common mode output voltage.

9 Claims, 1 Drawing Sheet

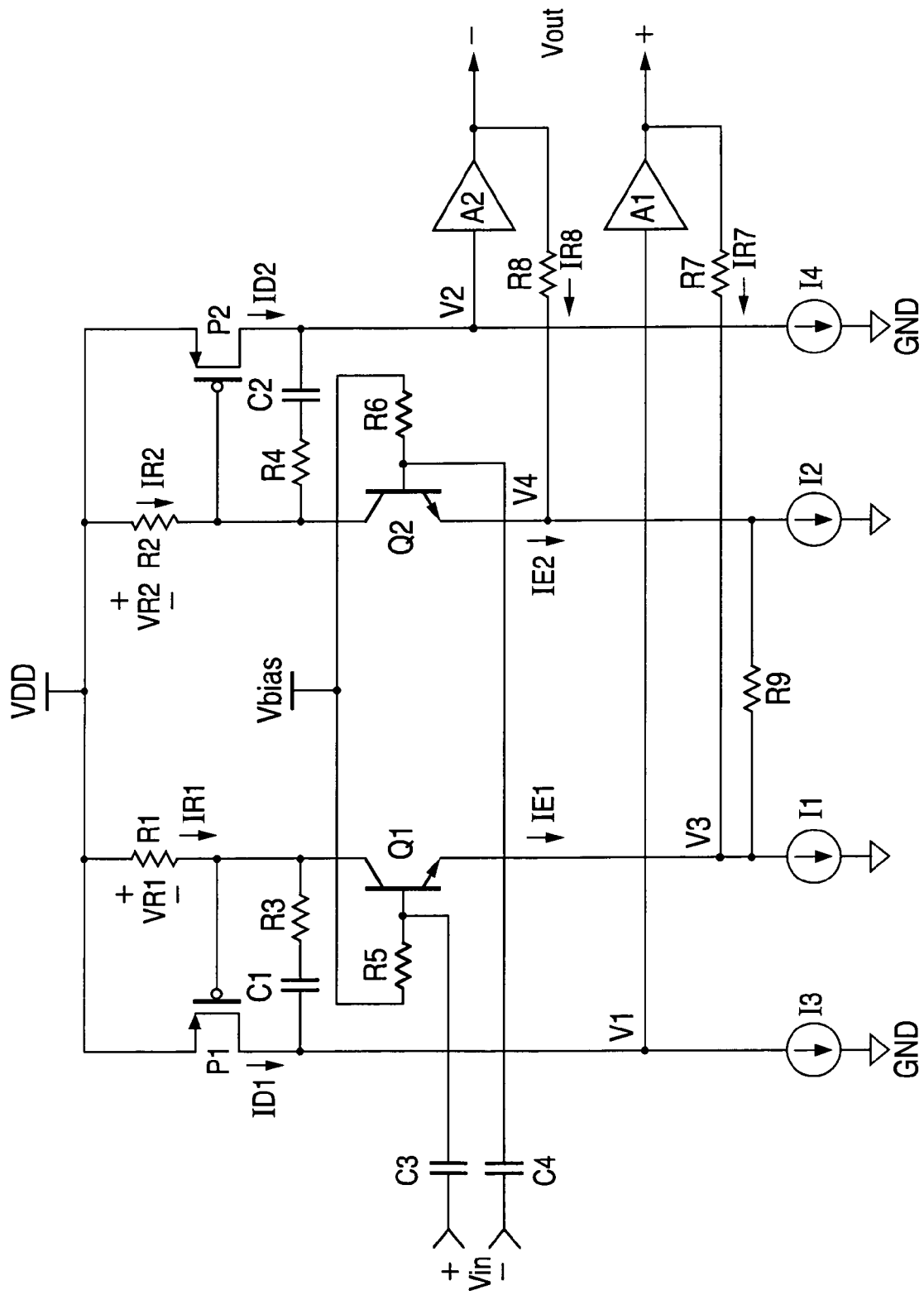

US 7,279,976 B1

DIFFERENTIAL AMPLIFIER WITH CONTROLLED COMMON MODE OUTPUT VOLTAGE

FIELD OF THE INVENTION

The present invention relates to differential amplifier circuits, and in particular, to fully differential amplifier circuits with a controlled common mode output voltage.

DESCRIPTION OF THE RELATED ART

Differential signals and the amplifier circuits for generating and propagating such signals have been well known in the art for a long time. Such signals and circuits, however, are seeing increasing use due to their advantageous noise immunity, particularly with circuits now increasingly using lower power supply voltages, thereby making them more sensitive to noise and other forms of common mode signal interference.

A problem with such circuits has been maintaining consistent common mode voltages throughout the differential signal path. This has become increasingly important with, as noted above, lower power supply voltages, since even small common mode voltage variations can nonetheless be relatively large in view of the small power supply voltage. While many techniques have been used to maintain a desired common mode voltage, such techniques generally include the use of feedback circuits which tend to increase circuit size and complexity and can introduce performance variations of their own.

SUMMARY OF THE INVENTION

In accordance with the presently claimed invention, a differential amplifier circuit is provided with a self-controlled common mode output voltage.

In accordance with one embodiment of the presently claimed invention, a differential amplifier circuit with a controlled common mode output voltage includes a bias electrode to convey a DC bias voltage, and differential amplifier circuitry. The differential amplifier circuitry includes first and second circuit stages, and is responsive to an AC-coupled differential input signal received via first and second input electrodes by providing a differential output signal with first and second output signal phases via first and second output electrodes, respectively. The first and second input electrodes are DC-coupled to the bias electrode, the first circuit stage includes the first input electrode, the first output electrode, a first feedback electrode and first feedback circuitry DC-coupled between the first output and feedback electrodes, and the second circuit stage includes the second input electrode, the second output electrode, a second feedback electrode and second feedback circuitry DC-coupled between the second output and feedback electrodes. The first and second output electrodes and the first and second feedback electrodes are maintained at a plurality of respective DC voltages each of which is substantially equal to a predetermined value related to the DC bias voltage.

In accordance with another embodiment of the presently claimed invention, a differential amplifier circuit with a controlled common mode output voltage includes a bias electrode to convey a DC bias voltage, first and second output electrodes to convey a differential output signal with first and second output signal phases, differential input amplifier circuitry, buffer circuitry and feedback circuitry. The differential input amplifier circuitry includes first and second circuit stages, and is responsive to an AC-coupled differential input signal received via first and second input electrodes by providing first and second intermediate signals via first and second intermediate electrodes, respectively. The first and second input electrodes are DC-coupled to the bias electrode, the first circuit stage includes the first input electrode, the first intermediate electrode, and a first feedback electrode, and the second circuit stage includes the second input electrode, the second intermediate electrode, and a second feedback electrode. First buffer circuitry is DC-coupled between the first intermediate and output electrodes, and responsive to the first intermediate signal by providing the first output signal phase. Second buffer circuitry is DC-coupled between the second intermediate and output electrodes, and responsive to the second intermediate signal by providing the second output signal phase. First feedback circuitry is DC-coupled between the first output and feedback electrodes, and second feedback circuitry is DC-coupled between the second output and feedback electrodes. The first and second output electrodes and the first and second feedback electrodes are maintained at a plurality of respective DC voltages each of which is substantially equal to a predetermined value related to the DC bias voltage.

BRIEF DESCRIPTION OF THE DRAWING

The FIGURE is a schematic diagram of a differential amplifier circuit with a controlled common mode output voltage in accordance with one embodiment of the presently claimed invention.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal.

Referring to the Figure, a differential amplifier circuit with a controlled common mode output voltage in accordance with one embodiment of the presently claimed invention includes a differential input stage implemented with NPN bipolar junction transistors Q1, Q2. Current source circuits I1, I2, I3, I4 provide constant biasing currents I1, I2, I3, I4 for transistors Q1 and Q2, and for P-type metal oxide semiconductor field effect transistors (MOSFETs) P1 and P2. The base electrodes of transistors Q1 and Q2 are biased to a common DC bias voltage Vbias through respective current limiting resistors R5, R6. The differential input signal Vin is AC-coupled through series coupling capacitors C3, C4 to the base electrodes of transistors Q1 and Q2. Under nominal operating conditions, this biasing of transistors Q1 and Q2 causes collector currents IR1 and IR2 to flow, via resistors R1 and R2, respectively, and emitter currents IE1 and IE2 to flow. This causes voltage drops VR1 and VR2 across resistors R1 and R2, respectively, thereby providing the necessary gate-to-source biasing for transistors P1 and P2. Voltages V1 and V2 at the drain electrodes of transistors P1 and P2, respectively, are buffered by output buffer amplifiers A1 and A2 to provide the two signal phases of the differential output signal Vout. The series resistor-capacitor networks R3 and C1, and R4 and C2 are included for maintaining circuit stability. Resistor R9 provides DC coupling between the emitter electrodes of transistors Q1 and Q2.

Feedback resistors R7 and R8 advantageously provide control for the output common mode voltage, i.e., by maintaining the DC voltage components of voltages V1 and V2 at the desired common mode voltage, which is typically equal to the DC voltage components of voltages V3 and V4 at the emitter electrodes of transistors Q1 and Q2, respectively. This common mode voltage is typically equal to one-half of the power supply voltage VDD.

For example, for a power supply voltage VDD of 5.0 volts, the desired common mode voltage may be 2.5 volts. Hence, it is desired to maintain the DC voltage components of voltages V1, V2, V3 and V4 at 2.5 volts. Accordingly, the DC bias voltage Vbias applied to the base electrodes of transistors Q1 and Q2 via current limiting resistors R5 and R6 will be substantially equal to the common mode voltage plus one base-to-emitter voltage VBE of transistors Q1 and Q2 (e.g., 3.2 volts for a typical base-to-emitter voltage VBE of 0.7 volts). Since the input signal Vin is AC-coupled, it arrives at the common mode voltage established at the base electrodes of transistors Q1 and Q2. Accordingly, due to the emitter follower operation of transistors Q1 and Q2, the signal component of the voltages V3, V4 at the emitter electrodes of transistors Q1 and Q2 is at the desired common mode voltage. The resulting signal components across resistors R1 and R2 are amplified by transistors P1 and P2 to produce the output signal components of voltages V1 and V2 at their respective drain electrodes. These voltages V1, V2 are buffered by the buffer amplifiers A1, A2 to produce the output signal Vout.

In the event that the DC voltage components of the signal phases of the output voltage Vout are greater than the desired common mode voltage, i.e., greater than the DC voltages established at the emitter electrodes of transistors Q1 and Q2, as discussed above, DC currents IR7 and IR8 will flow through resistors R7 and R8, respectively, from the output electrodes to the mutually connected electrodes of transistor Q1 and current source I1, and transistor Q2 and current source I2. These currents IR7 and IR8 sum with emitter currents IE1 and IE2, respectively. However, the resulting combined currents IR7+IE1 and IR8+IE2 are limited to the currents I1 and I2 being sunk by current sources I1 and I2, respectively. As a result, the emitter currents IE1 and IE2 through transistors Q1 and Q2 must decrease, thereby also causing their collector currents IR1 and IR2 to decrease. This, in turn, reduces the voltage drops VR1 and VR2 across resistors R1 and R2, respectively, thereby decreasing the gate-to-source voltages VGS of transistors P1 and P2. With reduced bias voltages VGS at their gate electrodes, transistors P1 and P2 become less conductive by conducting lower drain currents ID1, ID2, thereby causing the DC voltages at their drain electrodes to decrease, thereby decreasing the DC voltage components of voltages V1 and V2. As a result, the DC voltage components of the output signal Vout also decrease (due to the action of the buffer amplifiers A1 and A2), thereby bringing the DC voltage components of the output signal Vout back to the desired common mode voltage as established at the emitter electrodes of transistors Q1 and Q2.

Conversely, in the event that the DC voltage components of the signal phases of the output voltage Vout are less than the desired common mode voltage, i.e., less than the DC voltages established at the emitter electrodes of transistors Q1 and Q2, as discussed above, DC currents IR7 and IR8 will flow through resistors R7 and R8, respectively, to the output electrodes from the mutually connected electrodes of transistor Q1 and current source I1, and transistor Q2 and current source I2. These currents IR7 and IR8 subtract from the emitter currents IE1 and IE2, respectively. However, the resulting currents IE1-IR7 and IE2-IR8 must still equal the currents I1 and I2 being sunk by current sources I1 and I2, respectively. As a result, the emitter currents IE1 and IE2 through transistors Q1 and Q2 must increase, thereby also causing their collector currents IR1 and IR2 to increase. This, in turn, increases the voltage drops VR1 and VR2 across resistors R1 and R2, respectively, thereby increasing the gate-to-source voltages VGS of transistors P1 and P2. With increased bias voltages VGS at their gate electrodes, transistors P1 and P2 become more conductive by conducting higher drain currents ID1, ID2, thereby causing the DC voltages at their drain electrodes to increase, thereby increasing the DC voltage components of voltages V1 and V2. As a result, the DC voltage components of the output signal Vout also increase (due to the action of the buffer amplifiers A1 and A2), thereby bringing the DC voltage components of the output signal Vout back to the desired common mode voltage as established at the emitter electrodes of transistors Q1 and Q2.

In addition to the self control of the output common mode voltage, this circuit also advantageously minimizes variations in the signal components of voltages V1 and V2 caused by variations in the biasing threshold voltages of transistors P1 and P2. This is accomplished by ensuring that the resistance value of resistors R7 and R8 (preferably mutually equal) is substantially greater than the resistance value of resistors R1 and R2 (preferably mutually equal). As a result, variations in the output signal component of voltages V1 and V2 due to variations in the threshold voltages of transistors P1 and P2 are reduced in proportion to the circuit gain.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed:

1. An apparatus including a differential amplifier circuit with a controlled common mode output voltage, comprising:
    first and second power supply electrodes to convey a power supply voltage;
    a bias electrode to convey a DC bias voltage; and
    differential amplifier circuitry including first and second circuit stages, coupled between said first and second power supply electrodes, and responsive to said power supply voltage and an AC-coupled differential input signal received via first and second input electrodes by providing a differential output signal with first and second output signal phases via first and second output electrodes, respectively, wherein
- said first and second input electrodes are DC-coupled to said bias electrode,
- said first circuit stage includes said first input electrode, said first output electrode, a first feedback electrode and first feedback circuitry DC-coupled between said first output and feedback electrodes, and
- said second circuit stage includes said second input electrode, said second output electrode, a second feedback electrode and second feedback circuitry DC-coupled between said second output and feedback electrodes;
- wherein said first and second output electrodes and said first and second feedback electrodes are maintained at a plurality of respective DC voltages each of which is substantially equal to a predetermined value related to said DC bias voltage.

2. The apparatus of claim 1, wherein:
- said first circuit stage comprises a first bipolar junction transistor with base and emitter electrodes as said first input and feedback electrodes; and
- said second circuit stage comprises a second bipolar junction transistor with base and emitter electrodes as said second input and feedback electrodes.

3. The apparatus of claim 1, wherein said first and second feedback electrodes are mutually DC-coupled.

4. The apparatus of claim 1, wherein said first and second feedback circuitries comprise first and second resistances.

5. An apparatus including a differential amplifier circuit with a controlled common mode output voltage, comprising:
- power supply means for receiving a power supply voltage;
- biasing means for receiving a DC bias voltage; and
- differential amplifier means for responding to said power supply voltage, said DC bias voltage and an AC-coupled differential input signal received via first and second input electrodes by providing a differential output signal with first and second output signal phases via first and second output electrodes, respectively, wherein
  - said first and second input electrodes are DC-coupled to said biasing means,
  - a first portion of said differential amplifier means includes said first input electrode, said first output electrode, a first feedback electrode and first feedback means DC-coupled between said first output and feedback electrodes, and
  - a second portion of said differential amplifier means includes said second input electrode, said second output electrode, a second feedback electrode and second feedback means DC-coupled between said second output and feedback electrodes;
  - wherein said first and second output electrodes and said first and second feedback electrodes are maintained at a plurality of respective DC voltages each of which is substantially equal to a predetermined value related to said DC bias voltage.

6. An apparatus including a differential amplifier circuit with a controlled common mode output voltage, comprising:
- first and second power supply electrodes to convey a power supply voltage;
- a bias electrode to convey a DC bias voltage;
- first and second output electrodes to convey a differential output signal with first and second output signal phases;
- differential input amplifier circuitry including first and second circuit stages, coupled between said first and second power supply electrodes, and responsive to said power supply voltage and an AC-coupled differential input signal received via first and second input electrodes by providing first and second intermediate signals via first and second intermediate electrodes, respectively, wherein
  - said first and second input electrodes are DC-coupled to said bias electrode,
  - said first circuit stage includes said first input electrode, said first intermediate electrode, and a first feedback electrode, and
  - said second circuit stage includes said second input electrode, said second intermediate electrode, and a second feedback electrode;
- first buffer circuitry DC-coupled between said first intermediate and output electrodes, and responsive to said first intermediate signal by providing said first output signal phase;
- second buffer circuitry DC-coupled between said second intermediate and output electrodes, and responsive to said second intermediate signal by providing said second output signal phase;
- first feedback circuitry DC-coupled between said first output and feedback electrodes; and
- second feedback circuitry DC-coupled between said second output and feedback electrodes;
- wherein said first and second output electrodes and said first and second feedback electrodes are maintained at a plurality of respective DC voltages each of which is substantially equal to a predetermined value related to said DC bias voltage.

7. The apparatus of claim 6, wherein:
- said first circuit stage comprises a first bipolar junction transistor with base and emitter electrodes as said first input and feedback electrodes; and
- said second circuit stage comprises a second bipolar junction transistor with base and emitter electrodes as said second input and feedback electrodes.

8. The apparatus of claim 6, wherein said first and second feedback electrodes are mutually DC-coupled.

9. The apparatus of claim 6, wherein said first and second feedback circuitries comprise first and second resistances.

* * * * *